United States Patent [19]
Kikuchi et al.

[11] Patent Number: 5,226,056
[45] Date of Patent: Jul. 6, 1993

[54] PLASMA ASHING METHOD AND APPARATUS THEREFOR

[75] Inventors: Masashi Kikuchi, Fujisawa; Toshinari Takata, Chigasaki; Tokuo Watanabe, Yokosuka, all of Japan

[73] Assignee: Nihon Shinku Gijutsu Kabushiki Kaisha, Chigasaki, Japan

[21] Appl. No.: 462,380

[22] Filed: Jan. 9, 1990

[30] Foreign Application Priority Data

| Jan. 10, 1989 [JP] | Japan | 1-2042 |
| Jan. 10, 1989 [JP] | Japan | 1-2043 |
| Jan. 10, 1989 [JP] | Japan | 1-2044 |
| Jan. 10, 1989 [JP] | Japan | 1-2045 |

[51] Int. Cl.$^5$ .............................. H04B 7/00
[52] U.S. Cl. ........................ 373/18; 373/62; 156/345; 156/643; 156/646; 204/164; 204/192.1; 219/121.11; 219/121.36; 219/121.37; 219/121.4; 219/390
[58] Field of Search .............. 156/643, 646, 668, 345; 204/192 E, 164, 298; 373/40, 18, 22, 62; 219/10.55 E, 10.55 M, 10.67, 121.43, 390, 121.11, 121.36, 121.37, 121.4, 121.41, 383

[56] References Cited

U.S. PATENT DOCUMENTS

| 4,529,474 | 7/1985 | Fujiyama et al. | 156/643 |
| 4,533,820 | 8/1985 | Shimizu | 219/390 |
| 4,961,812 | 10/1990 | Baerg et al. | 156/643 |
| 4,983,254 | 1/1991 | Fujimura et al. | 156/643 |
| 5,034,086 | 7/1991 | Sato | 156/643 |

Primary Examiner—Bruce A. Reynolds
Assistant Examiner—Tu Hoang
Attorney, Agent, or Firm—Armstrong & Kubovcik

[57] ABSTRACT

In a method for plasma ashing a resist film coated on a substrate, the temperature of the substrate is controlled initially at temperatures below that at which explosion of the resist film occurs until a surface portion of a resist film has been removed. Thereafter, the substrate temperature is increased to remove the remaining portions of the resist film. An apparatus for conducting the method includes a plurality of supports, which may be movably disposed within a vacuum treatment chamber for moving the substrate away from a source of heat and for moving the substrate into contact with the heating source.

8 Claims, 10 Drawing Sheets

FIG.1 PRIOR ART
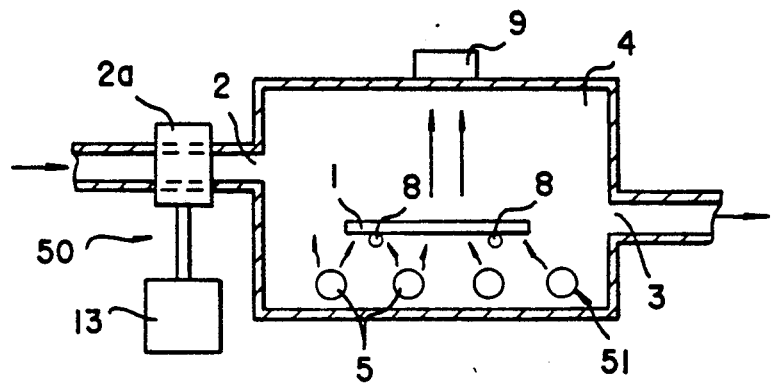
FIG.2 PRIOR ART
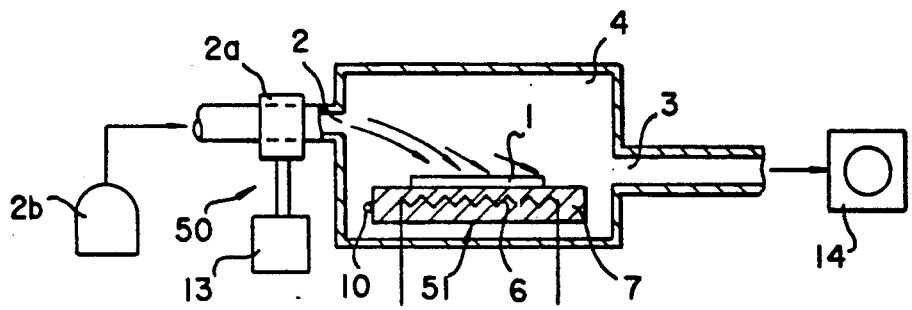
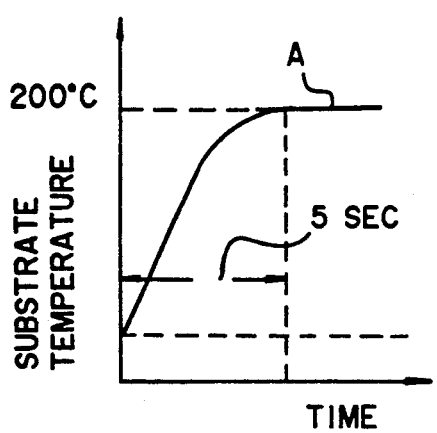
FIG.3 PRIOR ART
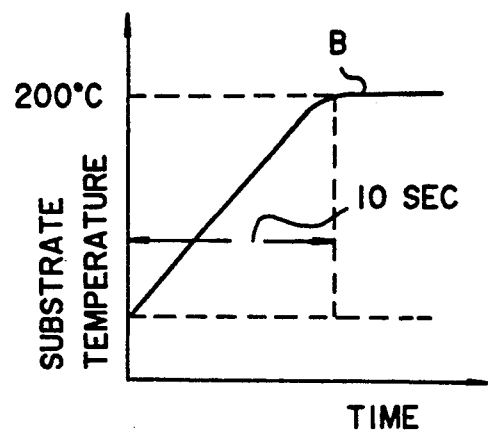
FIG.4 PRIOR ART

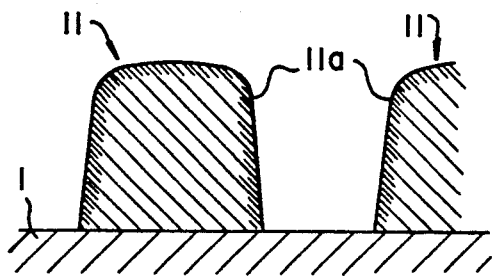
FIG.5 PRIOR ART
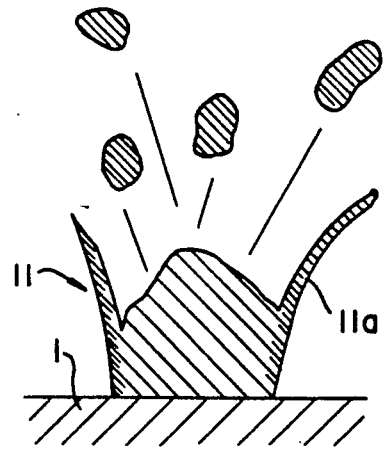
FIG.6 PRIOR ART
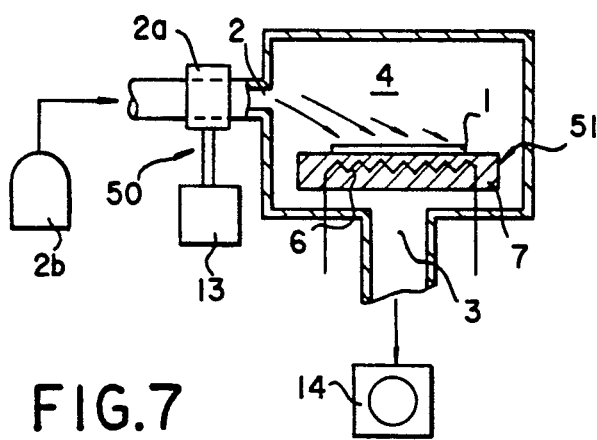
FIG.7 PRIOR ART
FIG.8 PRIOR ART
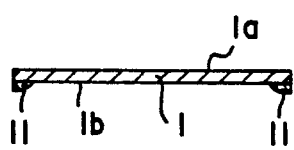
FIG.9 PRIOR ART
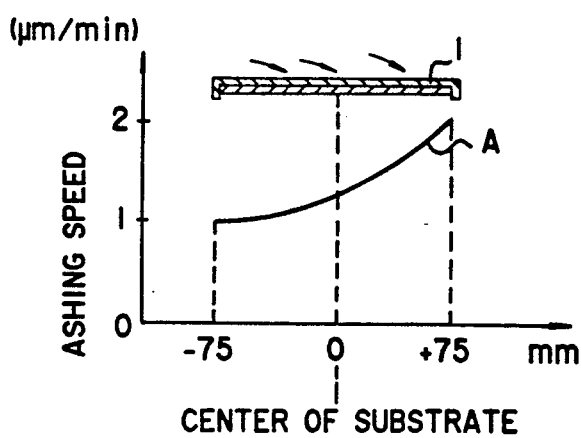
FIG.10 PRIOR ART

PLASMA ASHING METHOD AND APPARATUS THEREFOR

DETAILED DESCRIPTION OF THE INVENTION

1. Field of the Invention

This invention relates to a method and an apparatus for removing a resist film coated on a semiconductor substrate by ashing utilizing plasma.

2. Background of the Invention

In order to fabricate minute integrated circuits, a resist film having a circuit pattern is placed on the surface of a semiconductor substrate. The substrate is then etched, using the resist film as a template and then the resist film is removed.

Methods of removing the resist film can be divided into two groups (i.e., a wet treatment method in which chemicals such as hydrogen peroxide, organic solvents, and the like are used and a dry treatment method in which the resist film is ashed by an oxygen plasma).

Many of the chemicals used in the wet treatment method are harmful to humans and it is necessary to monitor the safety precautions used and the amount of pollution caused by waste liquids. Further, the chemicals used contain impurities which will cause voids in and contamination of the patterns of semiconductor circuits. Such chemicals are therefore not suitable to the fabrication, on a very large-scale, of integrated circuits.

In the dry treatment method, a resist film of $C_xH_yN_z$ coated on the substrate is caused to react with oxygen radicals generated in an oxygen plasma so as to remove the resist film by decomposing and evaporating the film into $CO_2$, $NO_2$ and $H_2O$. This method does not generate substances which are harmful to the human body and does not contain impurities, and it is suitable to the hyperfine fabrication of integrated circuits.

A specific example of the conventional dry treatment method is shown in FIGS. 1 and 2. A substrate 1 coated with a resist film is placed either above or on heating means 51 inside a vacuum treatment chamber 4. The heating means may be an infrared lamp 5 as shown in FIG. 1 or a hot plate 7 provided with a thermally controlled cast-in heater 6 as shown in FIG. 2. The vacuum treatment chamber 4 contains a reactive gas introduction port 2 and a vacuum exhaust port 3. Oxygen gas or a reactive gas obtained by mixing oxygen gas with a small quantity of $CF_4$, $N_2$ or $H_2$ to be introduced from the reactive gas introduction port 2 is converted to plasma by a plasma applicator 50 comprising a microwave discharging member 2a. The oxygen radicals or the radicals of the reactive gas are caused to react with the resist film on, the heated substrate 1. The resist film decomposes and evaporates and then is discharged from vacuum treatment chamber 4 by a vacuum pump.

In the example shown in FIG. 1, the substrate 1, placed on a rack 8 inside the vacuum treatment chamber 4, is heated by the infrared lamps 5 to a predetermined temperature in about 5 seconds as shown by the curve A in FIG. 3. The temperature of the substrate 1 is controlled by an infrared thermometer 9 which detects the infrared rays emitted from the surface of the substrate 1. The output signal of the thermometer 9 is fed back to the power source of the lamp 5 to maintain the temperature constant by controlling the electric power.

In the example shown in FIG. 2, the substrate 1 is supplied with heat by thermal contact with the hot plate 7, and is heated to a predetermined temperature in about 10 seconds as shown by the curve B in FIG. 4. The hot plate 7 is maintained at a constant temperature by means of a thermocouple-type thermometer 10.

Another example of the conventional dry treatment apparatus is shown in FIG. 7. In the arrangement shown in FIG. 7 a vacuum exhaust port 3 is provided directly under a substrate 1. In this construction, just like in the above-described example, the substrate 1 is placed on a hot plate 7; oxygen radicals or radicals of a reactive gas are generated by discharging of a microwave discharging member 2a connected to a microwave power source 13, to generate radicals of oxygen gas or the reactive gas obtained by mixing oxygen gas with a small quantity of $CF_4$, $N_2$, and $H_2$. The gas is introduced from a reactive gas source 2b connected to an introduction port 2; the radicals react with a resist film on the heated substrate 1, and then the resist film is decomposed and evacuated and discharged by a vacuum pump 14 via the vacuum exhaust port 3.

As circuits become finer, it has become frequent practice to utilize a resist film coated on a substrate 1 as a mask for locally doping impurities, by ionization, on the surface of the substrate 1. In this case, as shown in FIG. 5, the surface layer portion 11a of resist film 11, utilized as a mask, is affected and hardened by ion beams, and stresses are concentrated inside the surface layer. It is difficult to remove the resist film 11 by ashing in the above-described dry treatment method and if an attempt is made to remove the resist film 11 the surface layer 11a of resist film 11 may explode due to sudden thermal stresses. The flakes of the resist film 11 generated by the explosion would remain on the substrate 1 or inside the vacuum treatment chamber 4 as dust particles or residual matter and become an obstacle to the hyperfine fabrication of the substrate 1.

According to findings of the inventors, the lower limit of temperature of explosion of the resist film 11 varies with the conditions of ion doping and the type of resist, but it has been found that by lowering substrate temperatures in the range of about 70° to 160° C. the surface layer portions of the resist film 11a are removed during plasma ashing without causing the resist film to explode. The inventors have also observed that the wider the resist film 11, the more likely an explosion will occur.

The apparatus shown in FIGS. 1, 2 and 7 is called a downstream-type ashing apparatus because the radicals of the reactive gas are generated outside the vacuum treatment chamber and flow from an upper portion along the surface of the substrate together with the reactive gas, and are discharged from the vacuum exhaust port in a lower portion of the vacuum treatment chamber. This apparatus is advantageous in that the electrically charged particles do not strike the substrate and therefore the circuit pattern formed on the substrate is not damaged. However, as can be seen in FIGS. 8 & 9, it is difficult to coat the resist film 11 only on the front surface 1a of the substrate, which is a requirement of a hyperfine circuit, as the film is often deposited on the rear surface 1b of the substrate 1. There is a disadvantage in that if the substrate 1 is heated in contact with the hot plate 7, to remove the resist film 11 by ashing, the reactive radicals are prevented by the hot plate 7 from working on that resist film 11 which is present on the rear surface 1b, and the resist film 11 partly remains as shown in FIG. 9. If the resist film 11 which remains on the rear surface 1b of the substrate 1 is peeled off in the following processes of fabrication, it will contaminate the semiconductor manufacturing apparatus which should remain clean. Poor quality integrated circuits through adhesion of the peeled particles on the hyperfine circuits are also produced Furthermore, in the apparatus as shown in FIGS. 1, 2 and 7, the downward stream of the reactive gas flows along the surface of the substrate 1, from one side towards the other side, to ash the resist film 11. As can be seen from the ashing speed distribution shown by the curve A of FIG. 10, the ashing speed of the resist film on the upstream side of the reactive gas flow is considerably slower than that on the downstream side. There is, therefore, a disadvantage in that it takes a long time to complete the ashing process.

A first object of this invention is to provide a method in which a resist film can be removed by ashing without an accompanying explosion of the resist.

A second object of this invention is to provide an apparatus in which a resist film can be removed from not only the front surface but also the rear surface of the substrate.

Another object of this invention is to provide an apparatus in which a resist film whose surface layer has been affected and hardened can be removed by ashing, and to remove the resist film by ashing without damaging the substrate.

A still further object of this invention is to provide an apparatus in which the time required for finishing the ashing is shortened by making the ashing speed uniform.

BRIEF SUMMARY OF THE INVENTION

In this invention, as a method of attaining the above-described first object, there is provided a method which comprises the steps of:

providing inside a vacuum treatment chamber a substrate coated with a resist film;

ashing the resist film with an oxygen plasma while heating the substrate to remove the resist film;

controlling the temperature of the substrate at a low temperature until the surface layer of the resist film has been removed; and increasing the temperature thereafter to a high temperature to remove remaining resist film.

In order to solve the second object as described above, there is proposed a plasma ashing apparatus which comprises:

a vacuum treatment chamber for receiving a substrate coated with a resist film, the vacuum treatment chamber having a vacuum exhaust port, heating means for heating the substrate, and an inlet port for a reactive gas, the inlet port being provided with a plasma applicator to thereby remove the resist film on said substrate by ashing with radicals of a reactive gas to be introduced from the inlet port, wherein a plurality of pins are provided inside the vacuum treatment chamber to support the substrate at a distance from the heating means by supporting the rear surface of the substrate.

In the proposed apparatus, it is preferable to dispose the plurality of pins movably between an advanced position and a retracted position, the advanced position being such that a distance is formed between the rear surface of the substrate and the heating means, and the retracted position being such that the rear surface of the substrate contacts the heating means.

Further, as a plasma ashing apparatus capable of removing a resist film which has been affected and hardened on its surface layer, and capable of removing the resist film by ashing without damaging the substrate, there is proposed a plasma ashing apparatus which incorporates a vacuum treatment chamber for receiving a substrate coated with a resist film, the vacuum treatment chamber having a vacuum exhaust port, heating means for heating the substrate, and a reactive gas introduction port provided with a plasma applicator to thereby remove the resist film on the substrate by ashing;

wherein a front electrode is disposed in front of the substrate in an opposed relationship thereto at a distance capable of generating plasma;

a rear electrode is disposed on the rear side of the substrate in an opposed relationship thereto at a narrow distance incapable of generating plasma; and each of the electrodes is selectively connected to a high-frequency power source and ground respectively.

In this embodiment it is preferable that the front electrode, which is disposed in an opposed relationship to the substrate, be comprised of a planer plate having a multitude of perforations.

An object of shortening the time required for completing the ashing by making the ashing speed, uniform, can be attained by a plasma ashing apparatus which includes:

a vacuum treatment chamber for receiving a substrate coated with a photoresist film on a surface thereof, the vacuum treatment chamber having therein heating means to heat the substrate, a reactive gas introduction pipe for flowing a reactive gas to the vacuum treatment chamber and having in an intermediate portion thereof a plasma applicator to generate a plasma of the reactive gas, a vacuum exhaust pipe connected to a vacuum pump, the introduction pipe and the vacuum exhaust pipe being connected to the vacuum treatment chamber, whereby the reactive gas to be introduced from the reactive gas introduction pipe in an ionized condition is caused to flow along the surface of the substrate to ash the resist film on the surface thereof;

wherein the inside of the vacuum treatment chamber is divided into two chambers by a shower plate, the shower plate having a perforated plate provided along the surface of the substrate;

the vacuum exhaust pipe is connected to that side of the two chambers in which the substrate is located; and the reactive gas introduction pipe is connected to the other side of the two chambers.

In this case, it is preferable that the shower plate be provided with small holes on the entire,, surface thereof, and a hole of relatively large diameter be formed in a position facing the central portion of the surface of the substrate. A vacuum exhaust pipe is connected to the vacuum treatment chamber such that it opens into a position facing the rear surface of the substrate, and a thermometer is provided to measure the temperature of the surface of the substrate through the relatively large diameter hole of the shower plate.

BRIEF DESCRIPTION OF THE DRAWINGS

FIGS. 1 and 2 are sectional side views showing a conventional ashing method.

FIG. 3 is a diagram showing the temperature changes of the substrate shown in FIG. 1.

FIG. 4 is a diagram showing temperature changes of the substrate shown in FIG. 2.

FIG. 5 is an enlarged sectional view of a resist film.

FIG. 6 is also an enlarged sectional view of a resist, the surface thereof being heated to temperatures causing the upper portion thereof to explode.

FIG. 7 is a sectional side view of a conventional ashing apparatus.

FIG. 8 is a sectional view of a substrate coated with a resist film.

FIG. 9 is a sectional view of a conventional substrate which has been treated by ashing showing remnants of the resist film.

FIG. 10 is a diagram showing the distribution of the ashing speed of the apparatus shown in FIG. 2.

FIGS. 20 through 29 are further concrete embodiments of this invention wherein:

FIG. 20 is a front view with part of the apparatus cut away;

FIG. 21 a sectional side view taken along the line XXII—XXII of FIG. 21;

FIG. 22 is a sectional plan view taken along the line XXIII—XXIII of FIG. 20;

FIG. 23 is a perspective view of a cassette case;

FIG. 24 is an enlarged view of a transfer apparatus;

FIG. 25 is an enlarged sectional side view of a plasma applicator;

FIG. 26 is a right-hand side view of FIG. 25; and

FIGS. 27 through 29 are enlarged sectional side views of a vacuum treatment chamber.

DETAILED DESCRIPTION OF THE INVENTION

Figure 11:
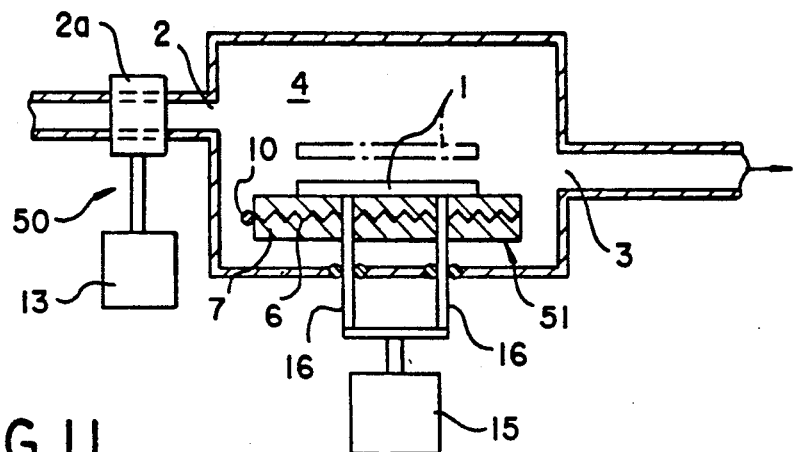
FIG. 11 is a sectional side view showing one embodiment of the method of this invention.

In order to remove a resist film coated on the surface of a substrate the, is placed inside a vacuum treatment chamber and oxygen plasma is introduced into the chamber while heating the substrate to ash the resist film. In this case the generation of flakes by explosion of the resist film can be prevented by maintaining the substrate temperature initially at temperatures lower than conventionally used at the beginning of the ashing process, and then raising the temperature. In the first low-temperature condition, the surface layer of the resist film which has been affected and hardened by radiation of the ion beams is removed without generating sudden thermal stresses (i.e., without exploding the resist film). Then the inner portion of the resist film is rapidly heated to a high temperature and ashed at a high speed.

The ashing of the resist film is performed by introducing a reactive gas in which radicals are generated through electric discharging with a plasma applicator, from the reactive gas introduction port into the vacuum treatment chamber, causing the radicals of the reactive gas to chemically react with the resist film of the substrate, and thus decomposing and evaporating it and removing it via the exhaust port. If the rear surface of the substrate is in contact with a heating means the resist film adhered to the rear surface thereof is not ashed. But by holding the substrate with a plurality of pins at a distance away from the heating means the radicals of the reactive gas can enter the space defined by the distance to thereby ash the resist film on the rear surface of the substrate.

When the surface portion of the resist film coated on the surface of the substrate is affected and hardened through radiation by ion beams, the substrate is placed inside the vacuum treatment chamber. The reactive gas is caused to flow from the reactive gas introduction port towards the exhaust port. A rear electrode which faces the rear surface of the substrate is connected to a high-frequency power source, and a front electrode which is disposed in front of the substrate is grounded. Since the distance between the substrate and the rear electrode is set at a distance too narrow for plasma to be generated, the substrate becomes substantially equal in electric potential to that of the rear electrode, and since it becomes negative in electric potential by the addition of high-frequency electric potential from the high-frequency power source, plasma discharging starts between the substrate and the front electrode which is grounded. The ions in the plasma are moved by the attraction of the electric potential of the substrate and strike the front surface of the substrate. The resist film coated on the surface of the substrate is sputtered by the striking ions, and the surface layer portion which has been affected and hardened can be physically peeled off and removed.

After the removal of the affected and hardened surface layer portion is completed, the substrate is heated by the heating means and the connection to the rear electrode is changed from the high-frequency power source to the ground, and the plasma applicator means is operated. Then, the reactive gas to be introduced from the introduction port to the vacuum treatment chamber is exited by the plasma and the generated radicals of the reactive gas are caused to chemically react with the resist film which remains on the substrate. The remaining resist film is ashed and is rapidly removed from the surface of the substrate. The decomposed and evaporated compositions are removed via the exhaust port.

In case damage to the surface of the substrate is feared, the high-frequency power source is connected to the front electrode and the rear electrode is grounded. In this case, since the front electrode becomes negative in electric potential and the substrate is grounded, the ions of plasma to be generated therebetween gently strike the surface of the substrate and do not damage it, and the resist film on the substrate is gently sputtered. When the affected and hardened surface portion of the resist film has been peeled off by sputtering, the substrate is heated by the heating means. The connection to the front electrode is changed from the high-frequency power source to ground, and the plasma applicator is operated to rapidly remove the remaining resist film by ashing with the radicals in the reactive gas which is introduced into the vacuum treatment chamber.

The radicals of the reactive gas flow towards the front side of the substrate through the perforations in the front electrode, thereby uniformly ashing the entire resist film.

The narrow distance between the rear electrode and the rear surface of the substrate is set, for example, to 1 mm at which no plasma is generated.

In another embodiment the inside of the vacuum treatment chamber is divided into two chambers by a shower plate. The shower plate comprises a perforated plate having a large-diameter hole in its center and small-diameter holes about the periphery of the large-diameter hole; the shower plate is disposed in front of the substrate which is disposed inside the vacuum treatment chamber. Also in this construction, the vacuum exhaust pipe is connected to that side of the two chambers in which the substrate is located, and the reactive gas introduction pipe is connected to the other side of the two chambers. Reactive gas introduced into the vacuum treatment chamber contacts the entire resist film through the plurality of perforations all at once creating a shower effect. The resist film decomposes and evaporates at a number of locations simultaneously through contact with the radicals of the reactive gas and can be removed uniformly at a rapid ashing speed. By providing a hole with large diameter in the center of the perforated plate, ashing can be performed with better uniformity.

Embodiments of this invention are explained in accordance with the accompanying drawing FIG. 11. In this drawing reference numerals 1 through 13, 50 and 51 denote the same elements as those of reference numerals 1 through 13 and 50 and 51 of FIGS. 1 and 2.

A first embodiment of the present invention incorporates a semiconductor substrate 1 constituted by a silicon wafer coated with a resist and supported by a rack 8 above a heating means 51 which has an infrared lamp 5 inside a vacuum treatment chamber 4 which is provided with a reactive gas introduction port 2 and a vacuum exhaust port 3.

FIG. 11 shows another embodiment in which a substrate 1 coated with a resist is disposed on a heating means 51 which incorporates a hot plate 7.

In any of the embodiments the reactive gas introduction port 2 is provided with a plasma applicator 50 for converting the reactive gas to plasma, the plasma applicator comprising an electric discharging means such as a microwave discharging member 2a, RF coil, and the like. Thus, oxygen gas or a reactive gas obtained by mixing oxygen gas with $CF_4$, $N_2$ or $H_2$ is excited by plasma and is introduced into the vacuum treatment chamber 4. The vacuum exhaust port 3 is connected to an appropriate vacuum pump to exhaust the vacuum treatment chamber 4 to maintain an atmosphere below $10^{-4}$ Torr, for example.

Figure 12:
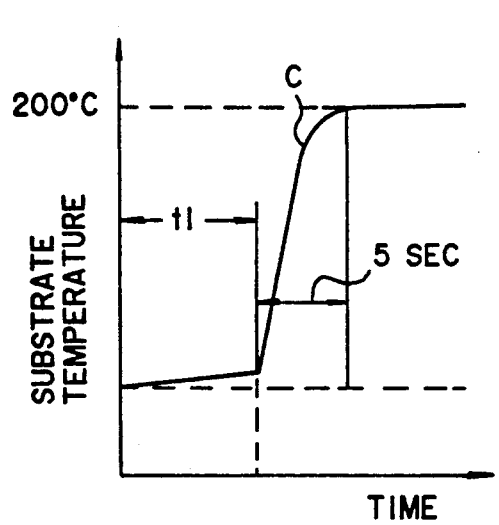
FIGS. 12 and 13 are diagrams showing the temperature changes of the substrate in the embodiments of the present invention.

The apparatus of the first embodiment of the present invention is similar to the conventional apparatus shown in FIG. 1. However, the substrate 1 has a resist film 11 with a surface layer 11a represented by $C_xH_yN_z$ which has been affected and hardened as shown in FIG. 5. The reactive gas excited by oxygen plasma and the like which is introduced from the reaction gas introduction port 2 is caused to act on the resist film 11 without switching on the infrared lamp 5 at the beginning. When the surface layer portion 11a has been removed by decomposition and evaporation through chemical reactions with oxygen radicals or radicals of the reactive gas, the lamp 5 is activated to heat the substrate 1 and accelerate the chemical reactions with oxygen radicals or radicals of the reactive gas to rapidly remove the resist film 11. The temperature of the substrate in this process is controlled as shown by the curve C shown in FIG. 12; lamp 5 is activated after a lapse of time $t_1$, which is required for removing the surface layer portion 11a, and the substrate reaches 200° C. in about 5 seconds, as in the conventional process, to rapidly remove the resist film 11.

Figure 13:
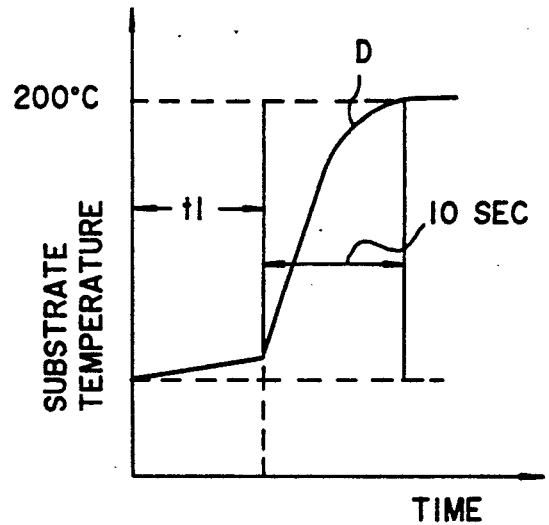

In the apparatus shown in FIG. 11, a plurality of pins 16 are connected to and moved up and down by a lifting apparatus 15 which encompasses an air cylinder located outside the vacuum treatment chamber 4. When pins 16 are lowered the substrate 1 is placed on the hot plate 7. If the apparatus in FIG. 11 is used to remove the resist film 11 the temperature change of the substrate is shown by curve D in FIG. 13. When the time $t_1$ required for removing the surface layer portion 11a is over, the substrate 1 is lowered onto the hot plate 7; the substrate then reaches 200° C. in about 10 seconds, as in the heating step of an apparatus having a conventional hot plate. After heating the removal of the remaining resist film 11 is performed.

In the apparatus of each of the embodiments discussed above, since the resist film 11 is removed by first removing the surface layer portion 11a at a low temperature and then the remaining portion at a high temperature, the resist is removed without exploding the internally stressed resist film 11. It is therefore possible to prevent the vacuum treatment chamber from being contaminated with flakes of the resist film 11, and fabrication of accurate and hyperfine circuits can be performed.

Figure 14:
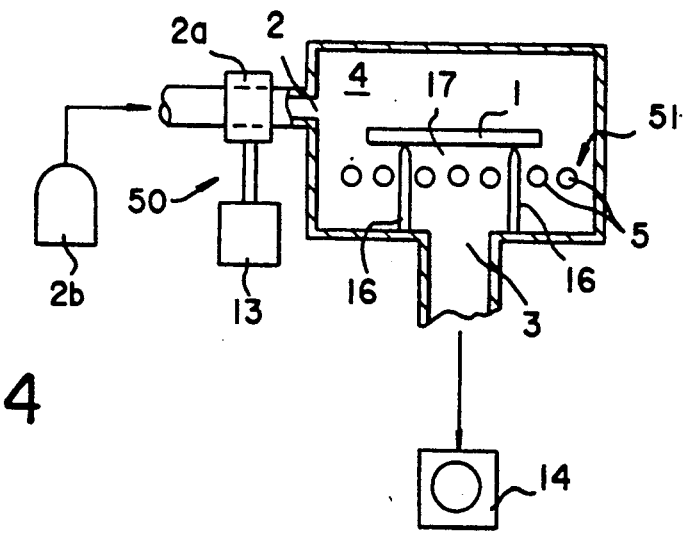
FIGS. 14 through 16 and FIG. 19 are sectional side views of embodiments of this invention.
Figure 15:
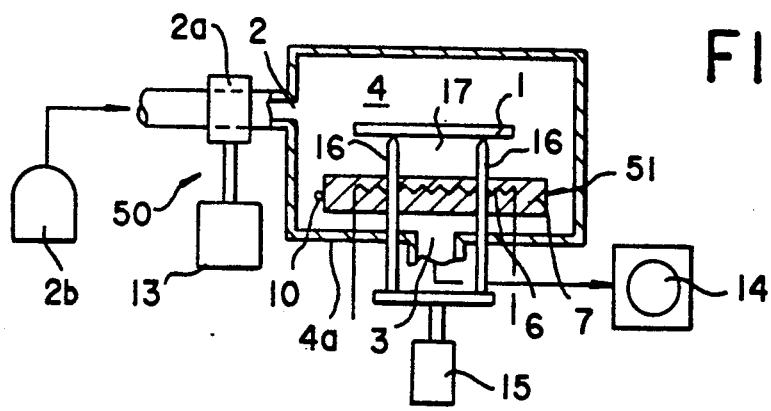

Two further embodiments are shown in FIGS. 14 and 15. In these figures reference numerals 1 through 16, 50 and 51 denote the same elements as those shown in FIGS. 1, 2, and 11.

In the embodiment shown in FIG. 14 a plurality of pins 16 are provided inside a vacuum treatment chamber 4 such that they project upwards through a heating means 51 which incorporates a plurality of infrared lamps 5. A vacuum exhaust port 3 is provided below the heating means. The rear surface of a substrate 1 is supported by the tips of the pins 16 so that a distance 17 is formed between the substrate 1 and heating means 51.

In the embodiment shown in FIG. 15, a plurality of pins 16 penetrate a heating means 51 (in the direction shown) which encompasses a hot plate 7. As a result the pins are introduced into the vacuum treatment chamber 4 from the outside thereof through a chamber wall 4a. Each pin 16 is connected to a lifting apparatus 15 which includes a cylinder provided outside the vacuum treatment chamber 4 such that it is freely movable in the upward and downward directions. A vacuum exhaust port 3 is provided below the heating means. Through the movement of the lifting apparatus 15, the substrate 1, supported on the end of pins 16, is made to move between a retracted position at which the substrate 1 contacts heating means 51 and an advanced position at which a distance is formed between the rear surface of the substrate 1 and heating means 51. Reactive gas to be sent from a reactive gas source 2b to the inside of the vacuum treatment chamber 4 is oxygen gas or a gas obtained by mixing oxygen gas with a small quantity of $CF_4$, $N_2$, or $H_2$ and $H_2$ is preferable.

In the embodiment shown in FIGS. 14 and 15 the resist film 11 on the substrate 1 is removed by heating the substrate 1 to, for example, 200° C. by heating means 51; introducing the reactive gas in which radicals are generated by the operation of a plasma applicator, into the vacuum treatment chamber 4 through a reactive gas introduction port 2; and removing the resist film 11 by ashing through chemical reactions with the radicals of the reactive gas.

The resist film 11 attached to the rear surface of the substrate 1 is removed, in the apparatus in FIG. 14, by ashing with the radicals which enter the distance 17 between the heating means and the substrate. In the apparatus shown in FIG. 15, the pins 16 are kept in the retracted position in which the substrate 1 and the heating means contact each other, until the resist film 11 on the front surface of the substrate 1 has been removed by ashing. Then, the pins 16 are positioned in the advanced position to form a distance 17 between the substrate 1 and the heating means. Thus, the resist film 11 on the rear surface 1b of the substrate 1 can be removed by the radicals which enter the space defined by the distance 17.

Figure 16:
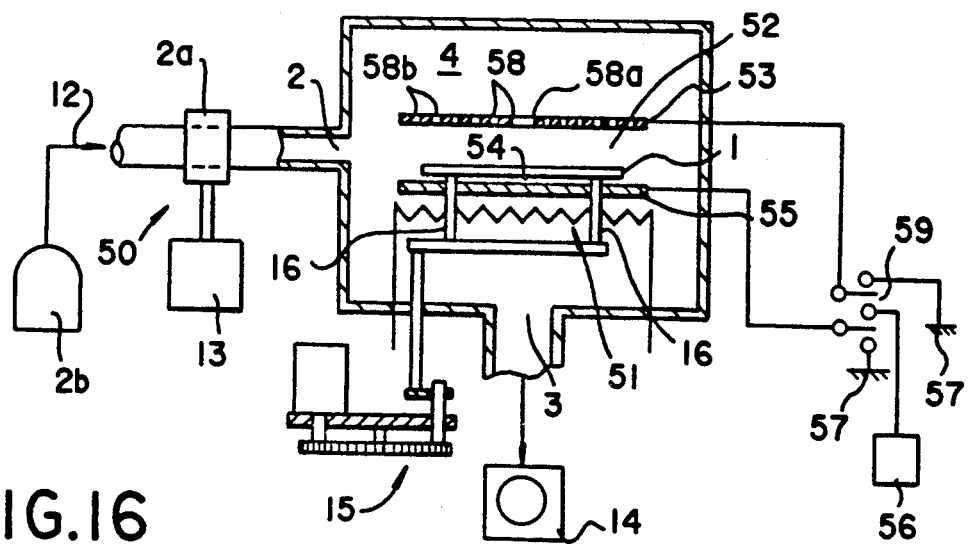
Figure 17:
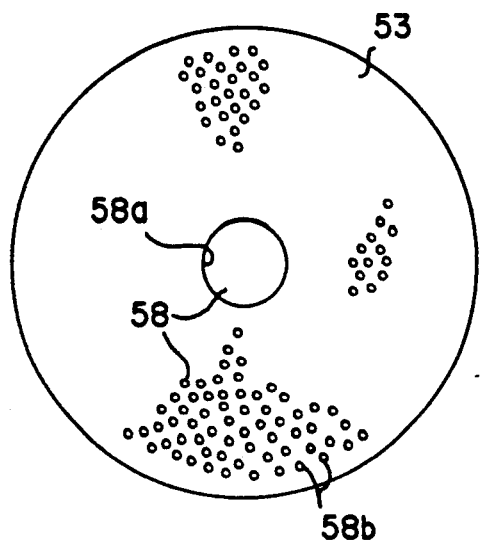
FIG. 17 is a plane disk-shaped front electrode having a multitude of perforations.
Figure 18:
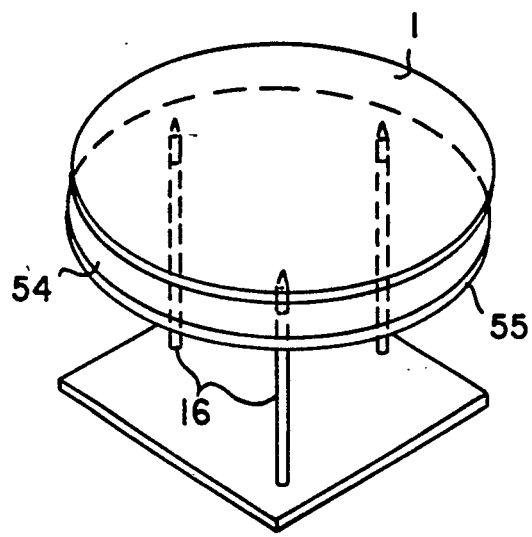
FIG. 18 is a perspective view showing the support for the substrate in the embodiment of FIG. 16.

Additional embodiments are shown in FIGS. 16 through 18. The reference numerals 1 through 16 and 50 and 51 represent the same elements as already explained.

Figure 19:
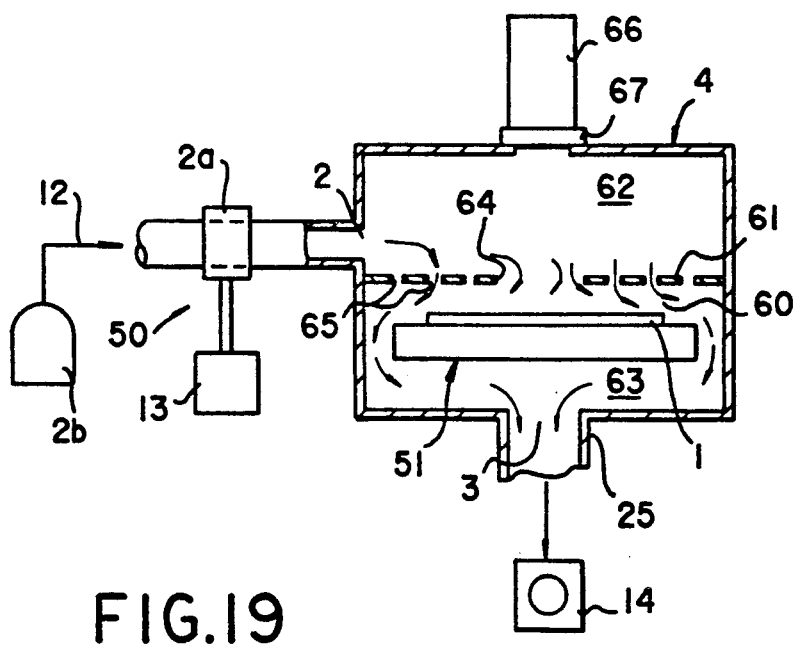

The device shown in FIG. 16 is similar to the device shown in FIG. 2, but also includes a front electrode 53 provided in front of the substrate 1 in opposing relation thereto and separated therefrom by a distance 52 to allow plasma to generate. A rear electrode 55 is provided behind the substrate 1 in opposing relation to the substrate and the two are separated by a narrow distance 54 in which no plasma is generated. Electrodes 53, 55 are selectively connected to a high-frequency power source 56 of 200 W, 13.56 MHz and ground 57. Electrodes 53, 55 are disposed at a distance of 20 mm, for example, and the vacuum treatment chamber 4 is adjusted to several Torr to $10^{-2}$ Torr. In this case, the front electrode 53, as shown in FIG. 17 is a plane disk shape with a multitude of perforations 58. The central perforation 58a has a large diameter of 28 mm, and the remaining perforations 58b are of small diameter (i.e., 1 mm). The small-diameter perforations 58b number about 1000 and are spaced at about a distance of 1 mm from each other. Further, in order to maintain the narrow distance, for example, of 1 mm, a plurality of pins 16, as shown in FIG. 19, are provided such that they penetrate rear electrode 55 and stop in a condition of protruding by 1 mm in the forward direction to place the substrate 1 on those pins 16.

As a reactive gas to be sent from a gas source 2b to the vacuum treatment chamber 4, oxygen gas, $N_2$ gas, $CF_4$ gas, $H_2$ gas, or a gas obtained by mixing oxygen gas with a small quantity of $CF_4$, $N_2$, or $H_2$, or by mixing oxygen gas is used with $N_2$ gas and $H_2$ gas.

The operation of removing by ashing the resist film 11 having a surface layer portion 11a which has been affected and hardened, using the apparatus shown in FIG. 16 is described as follows.

When the surface damage to the substrate 1 is of no concern the vacuum treatment chamber 4 is maintained at, for example, $10^{-1}$ Torr. A reactive gas is caused to flow from the gas source 2b to the vacuum exhaust port 3 at a rate of 5000 SCCM, for example. The front electrode 53 is connected to ground 57 and the rear electrode 55 is connected to a high-frequency power source 56. Since the distance 54 between the rear electrode 55 and the substrate 1 is narrow, the substrate 1 becomes negative in electric potential (i.e., it possesses the same electric potential as the rear electrode 55) so that plasma of the reactive gas is generated in the distance 52 between the front electrode 53 and the substrate 1. The ions in the plasma etch the resist film 11 on the surface of the substrate 1. When the surface layer portion 11a, of the resist film 11 which has been affected and hardened, has been peeled off by etching the substrate 1 is heated, for example, to 200° C. by the heating means 51. The rear electrode 55 is connected to ground 57 and, at the same time, a microwave power source of a plasma applicator 50 is switched on to generate plasma of the reactive gas in a plasma generating member 2a. The radicals, mainly oxygen radicals, of the reactive gas thus generated are caused to chemically react with the resist film 11 remaining on the substrate 1, and the resist film 11 is rapidly removed by ashing from the substrate 1.

When the substrate 1 is susceptible to damage, a switch 59 is changed over to connect the front electrode 53 to the high-frequency power source 56 and the rear electrode 55 is connected to ground 57. In this manner plasma of the reactive gas is generated in the distance 52. Since the front electrode 53 is in the negative electric potential, the ions in the plasma do not strike the substrate 1, which is in substantially the same electric potential as the ground, with great force but strike it gently, so that the resist film 11 can be softly etched without damaging the substrate 1. When the surface layer portion 11a of the resist film 11 which had been affected and hardened has been peeled off, the front electrode 53 is connected to ground 57 and the substrate 1 is heated, and the plasma applicator 50 is operated. Thus the resist film 11 which remains on the substrate 1 is rapidly removed.

In this case, the resist film 11 which adhered to the rear surface of the substrate 1, as shown in FIG. 8, can be removed by ashing because the radicals of the reactive gas, such as the oxygen radicals, penetrate into the distance 54.

Another embodiment is shown in FIG. 19. Reference numerals 1 through 14, 50 and 51 denote the same elements as those already explained. On the surface of the substrate 1, it is presumed that there is coated a photoresist film 11 having a general composition of $C_X H_Y N_Z$ as shown in FIG. 8.

The apparatus shown in FIG. 19 is provided with a shower plate 61 which is an aluminum perforated plate. The shower plate is disposed above the surface of a coated substrate 1 (which is coated with a photoresist film 11) and is separated from the substrate by a distance 60, so that the interior of a vacuum treatment chamber 4 is divided into two chambers 62, 63. A vacuum exhaust pipe 25 is connected to that side 63 of the two chambers which has the substrate 1 and a reactive gas introduction pipe 12 is connected to the other side 62 of the two chambers. The vacuum exhaust pipe 25 is provided such that it opens into a position facing the rear surface of the substrate 1. The reactive gas introduction pipe 12 is provided in the peripheral wall of the vacuum treatment chamber 4 at a slantingly upward position relative to the surface of the substrate 1.

The shower plate 61 is in the shape of a disk which is 17 cm in diameter and is provided with a perforation of a large hole 64 of 28 mm in diameter in a position facing the central portion of a 5-inch circular substrate 1. Shower plate 61 has about 1000 small holes 65 of 1 mm in diameter which are disposed at substantially equal distances from one another on remaining portions of the disk. The distance between the shower plate 61 and the surface of the substrate 1 is set, for example, to 7 mm.

As the reactive gas, a gas consisting essentially of oxygen is used; 5 slm of oxygen gas mixed with 300 SCCM of nitrogen gas or hydrogen gas is supplied to the reactive gas introduction pipe 12. In an intermediate position of the reactive gas introduction pipe 12 the reactive gas is converted to plasma by a plasma applicator which is applied with a microwave electric power of 750 W.

The substrate 1 is heated to, for example, 200° C. by heating means 51 of a hot plate type, and the resist film 11 is thereby heated to a temperature at which chemical reactions easily take place. Reference numeral 66 in FIG. 19 is an infrared thermometer which is provided in the vacuum treatment chamber 4. The infrared thermometer 66 measures the temperature of the substrate 1 through the large-diameter hole 64 in the shower plate 61 and a window 67 made of $CaF_2$.

The operation thereof is explained hereinbelow. The substrate 1 coated with the resist film 11 is placed on the heating means 51 inside the vacuum treatment chamber 4. The vacuum treatment chamber 4 is evacuated by exhausting through the vacuum exhaust pipe 25, and the substrate 1 is heated to 200° C. by the heating means 51. Then, a mixture of gas of oxygen gas and hydrogen gas is introduced into the vacuum treatment chamber 4 through the reactive gas introduction pipe 12 while controlling the pressure at 2 Torr. When plasma is generated in the reactive gas by operating the plasma applicator 50, the reactive gas rich in radical components contacts the surface of the substrate 1 in the form of a shower through the large-diameter hole 64 and the small-diameter holes 65 in the shower plate 61 to cause chemical reactions over the entire surface of the resist film 11. By these reactions, the resist film 11 is decomposed into $CO_2$ and $H_2O$ and evaporated and is consequently removed from the surface of the substrate 1 by discharging through the vacuum exhaust pipe 25.

Since a multitude of small holes 65 are formed in the shower plate 61 disposed in front of the surface of the substrate 1, the reactive gas is caused to contact the entire surface of the substrate 1 and, since the large-diameter hole 64 faces the central portion of the surface of substrate 1, the reactive gas is guided from the central portion of the surface towards the peripheries thereof. The resist film 11 can therefore be uniformly removed at a rapid ashing speed. When the substrate 1 is 5 inches in diameter, the ashing speed is 2.74 micron m/min. and the uniformity was ±5.3%.

Figure 22:
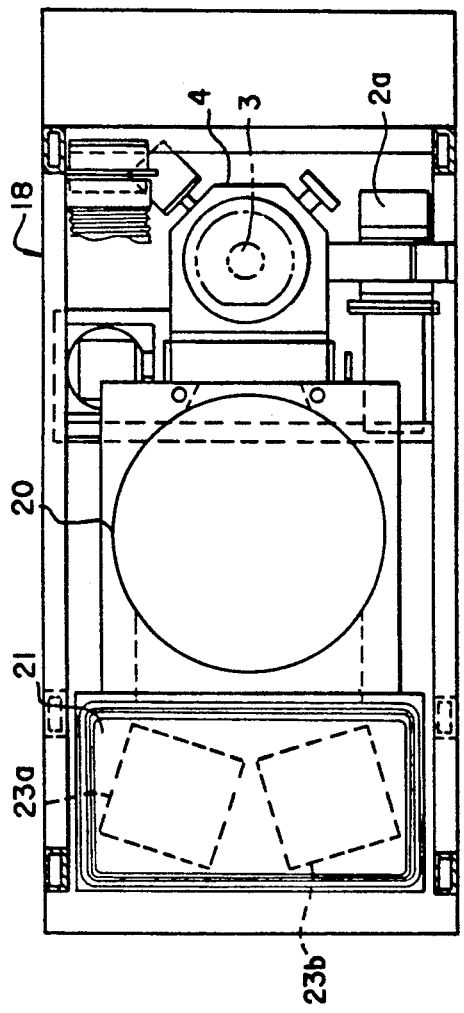
Figure 23:
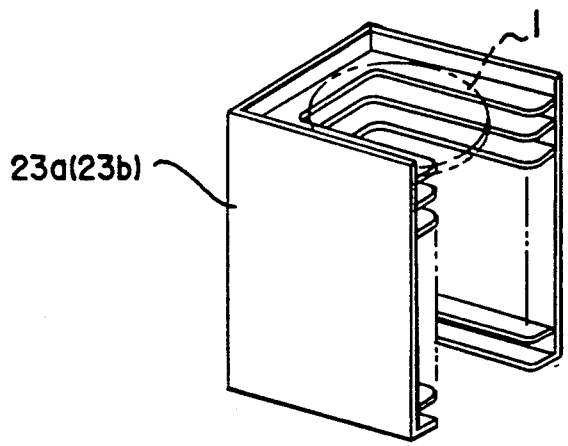

A further specific embodiment of the apparatus shown in FIG. 15 is explained with reference to FIGS. 20 through 22. In the figures, the reference numeral 18 denotes an apparatus body in the form of a frame. Above this frame 18 is attached a vacuum treatment chamber 4. To the side of the vacuum treatment chamber 4 is disposed a plasma applicator 50 having a microwave discharging member 2a. There is provided a reactive gas introduction pipe 12 which passes through the inside of the plasma applicator 50 to the vacuum treatment chamber 4 in communication with a reactive gas source 2b. Further, a transfer chamber 20 for transporting a substrate 1 into and out of the vacuum treatment chamber 4 through a valve 19 is provided in a position of about 90° swinging from the plasma applicator 50. A cassette chamber 21 is further provided in communication with the transfer chamber 20. Inside the cassette chamber 21 there are provided 2 tables which are separately operated up and down by two sets of elevating bars 22. On each of the tables there is placed a cassette case 23a, 23b of a shelf form, as shown in FIG. 23, which contain therein a plurality of substrates such that they are inserted and taken out in a sideway direction.

Figure 24:
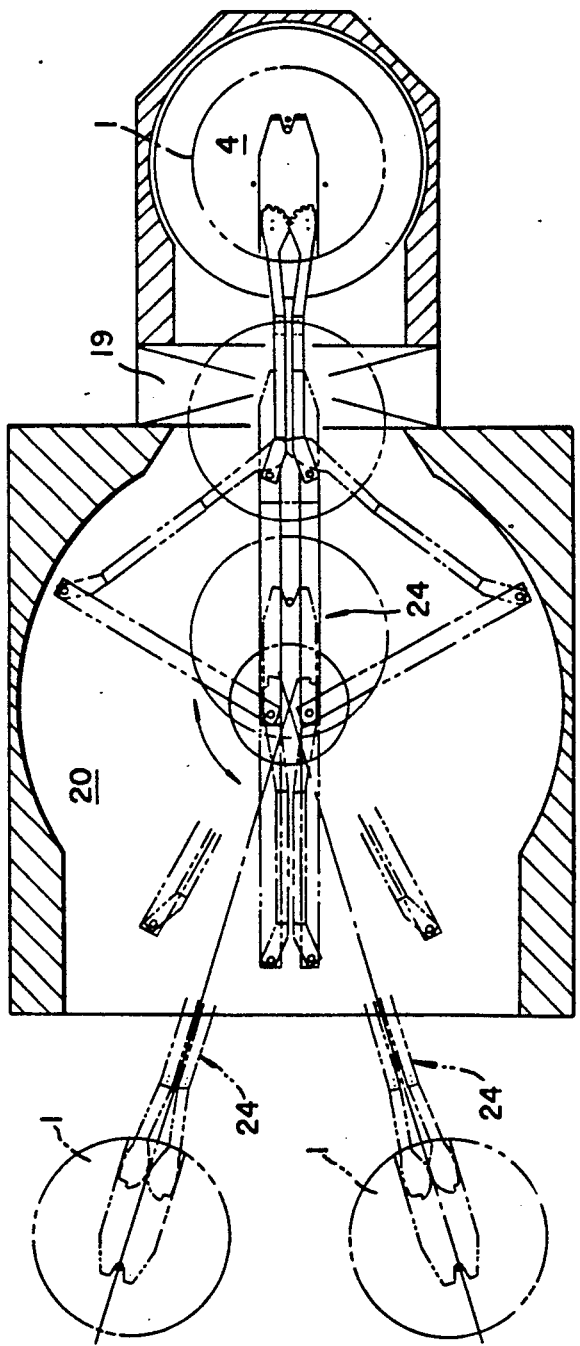

Substrates, to be ashed are kept in one 23a of the cassette cases. With the substrates are transferred to a predetermined position of the vacuum chamber 4 beginning with a bottom substrate. The downward movement of the table, and by means of a transfer apparatus 24 having a frog-arm shape, for example, as shown in FIG. 24 (all of the apparatus being hingedly arranged) the substrates are removed from the bottom up to the top. While the substrate is subjected to an ashing treatment in the vacuum treatment chamber 4, the valve 19 is kept closed and the transfer apparatus 24 is kept standing by in the transfer chamber 20. When the ashing treatment is finished, the transfer apparatus 24 again proceeds into the vacuum treatment chamber 4 through the opened valve 19 and returns to the transfer chamber 20 with the ashing-treated substrate placed thereon. The substrate is then transported into the other 23b of the cassette cases by the swinging movement of the transfer apparatus 24 and the extending movement of the arm, and is placed in a predetermined position by the lifting movement of the cassette case 23b. When the treated substrate has been placed in the other 23b of the cassette cases, the next substrate is taken out from the first one 23a of the cassette cases. By repeating these operations, the ashing treatment of the substrates is performed in succession.

A vacuum exhaust pipe 25 having a throttle valve 25a is connected to a lower side of the vacuum treatment chamber 4 for exhausting the vacuum treatment chamber 4 to a vacuum by means of a vacuum pump 14. The vacuum exhaust pipe 25 is branched at an intermediate portion for also connecting it to the cassette chamber 21 so that the cassette chamber 21 can also be exhausted to a vacuum.

Figure 21:
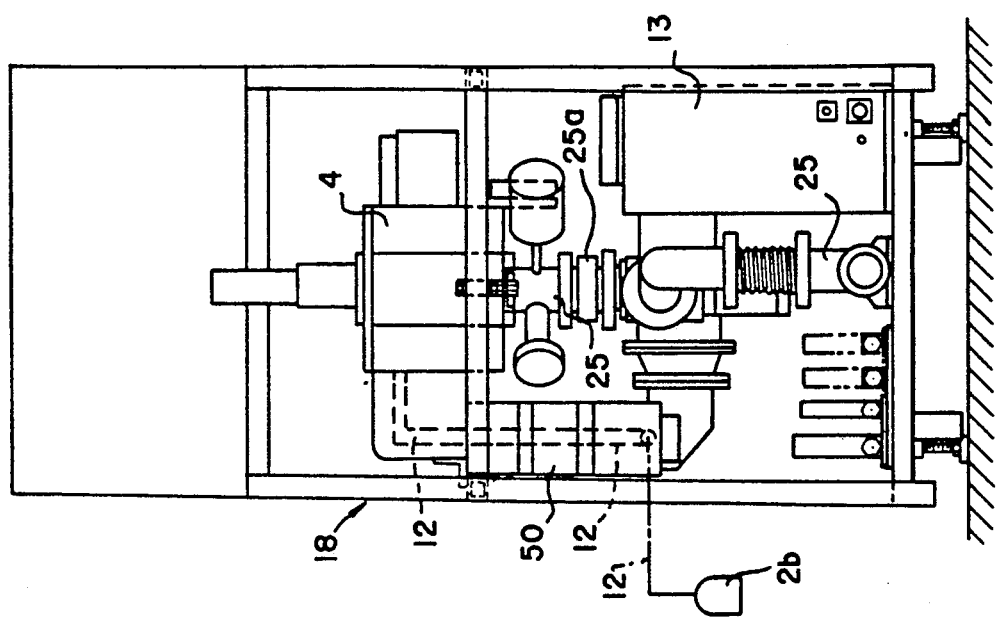
Figure 20:
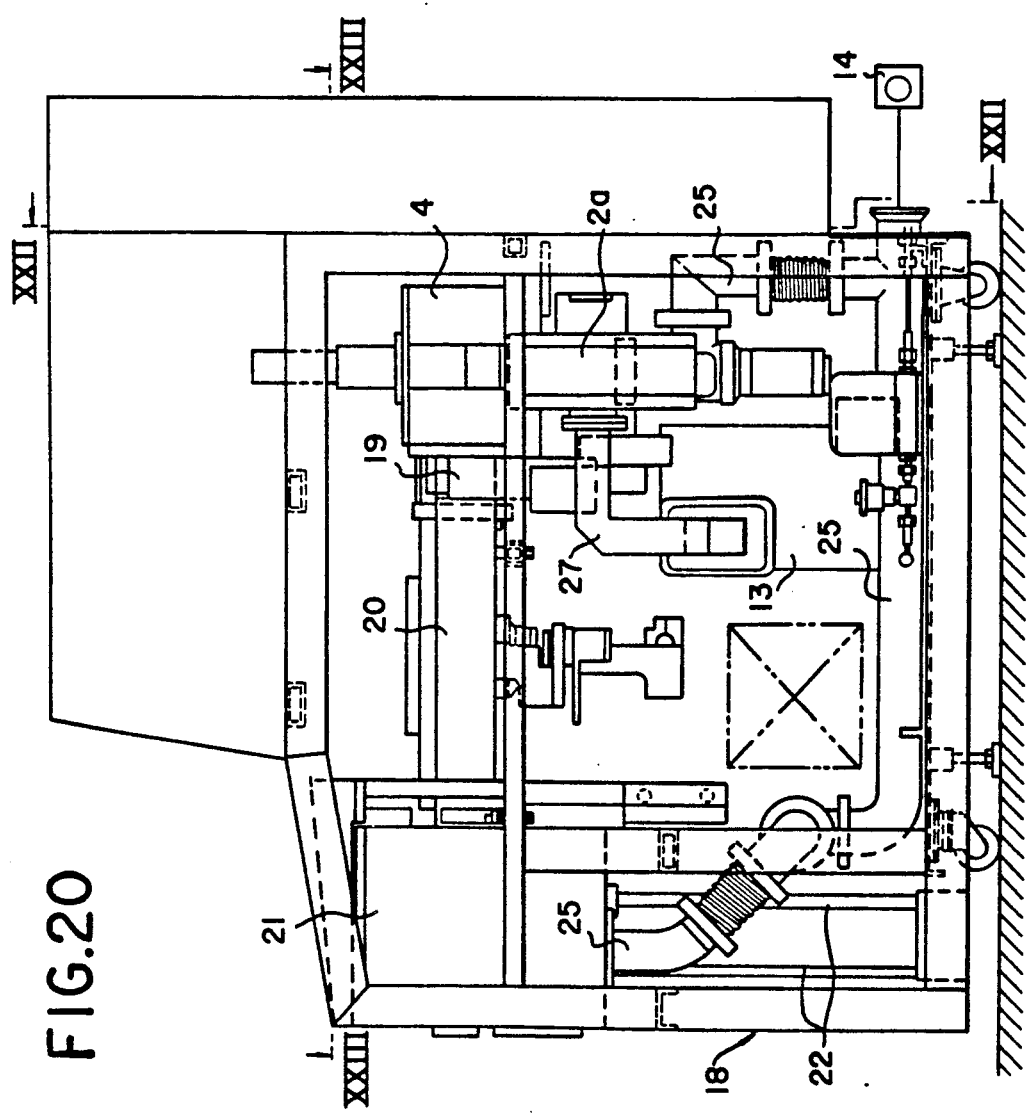

Microwaves generated by a microwave power source 13, as shown in FIGS. 20 and 21, are introduced into the microwave discharging member 2a of the plasma applicator 50 through a microwave wave guide 27.

Figure 25:
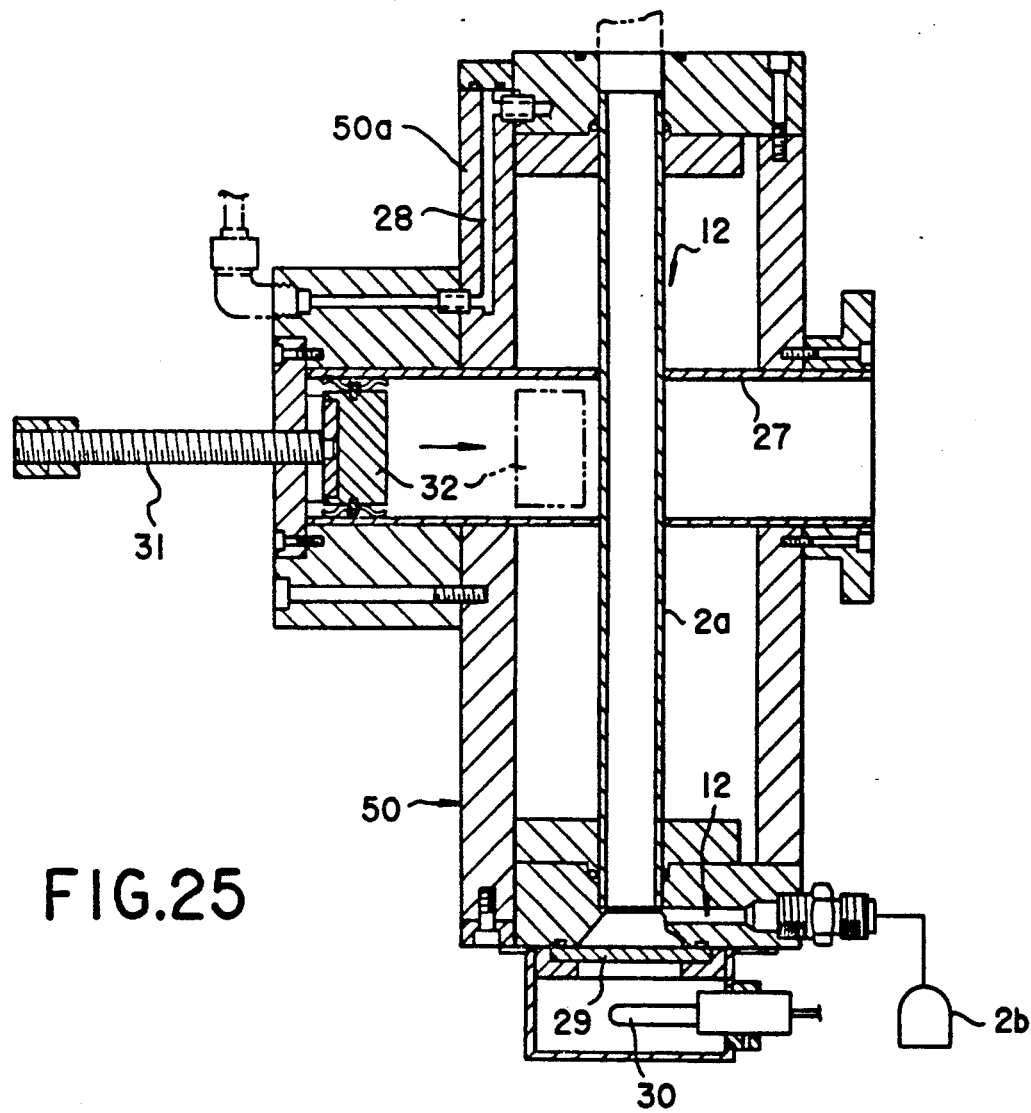
Figure 26:
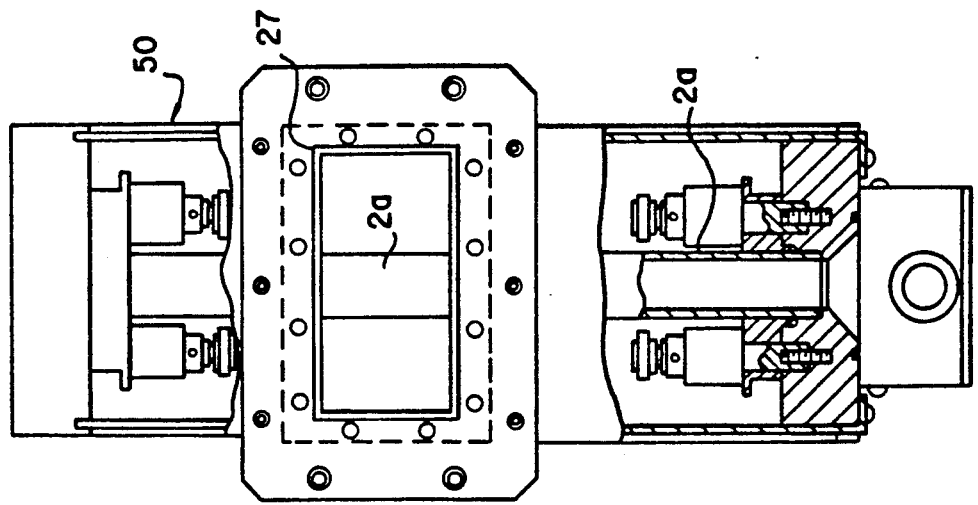

The details of the plasma applicator 50 are as shown in FIGS. 25 and 26. The microwave wave guide 27 is disposed such that it crosses a microwave discharging member 2a comprising a quartz tube which passes through the wave guide and which is connected to a reactive gas source 2b. In the crossing section the reactive gas is excited by the microwaves to generate plasma, and the radicals of the reactive elements are sent to the vacuum treatment chamber 4. The casing of the plasma applicator 50 is provided with a passage 28 for circulating therein cooling water to prevent the casing from being heated to a high temperature by plasma discharging. In that position of the casing 50a which lies ahead of an end of the quartz tube there is provided a mercury lamp 30 through a quartz window 29. The mercury lamp 30 is switched on at the beginning of plasma discharging to carry out the photoionization of the reactive gas inside the quartz tube 2a (microwave discharging member) so that microwave discharging can be started quickly. Furthermore, at an end of the wave guide 27 there is provided a sliding block 32 which moves forward and backward by the screwing of an adjusting screw 31 which extends outwards through the casing 50a. Matching of plasma discharging can thus be effected by the forward and backward movement of the sliding block.

Figure 27:
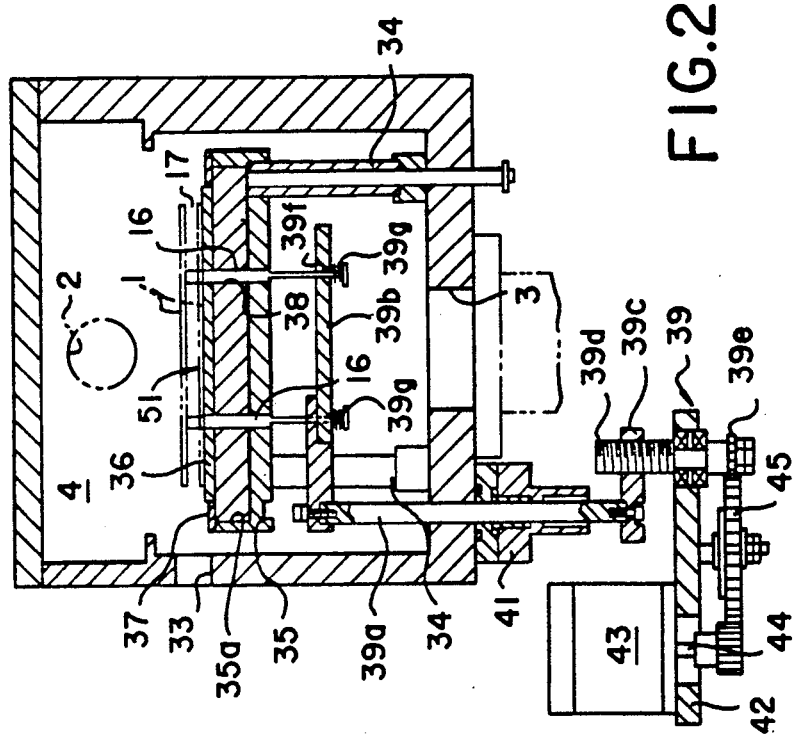

The details of the interior of the vacuum treatment chamber 4 are as shown in FIG. 27. It is formed by a cylindrical empty chamber which extends in the longitudinal direction. In the upper side portion thereof an opening 33 for receiving and taking out substrates 1 between the vacuum treatment chamber 4 and the transfer chamber 20 is provided, and introduction port 2 of the reactive gas introduction pipe 12 which is formed hingedly in a position at 90° C. relative to opening 33. And there is provided a holder 35 of Al$_2$O$_3$ having a circular concave portion 35a in a position slightly below the opening 33 of the vacuum treatment chamber 4. The holder is supported on the bottom surface of the vacuum treatment chamber 4 by means of a plurality of supports 34 of electrically insulating material of polytetraethylene. Inside the concave portion 35a is contained a heating means 51 which incorporates a sheath-type heater of a disk shape. The upper surface of the heating means 51 is covered by an insulating plate 36 of Al$_2$O$_3$, and the circumference of the upper surface of the heating means 51 is covered by a ring 37 of SiO$_2$. In the disk-shaped heating means 51 and the holder 35, three holes 38 are provided at an interval of 120° such that the holes penetrate heating means 51 and holder 35 in a vertical direction. Three pins 16 of quartz, which move vertically by a lifting apparatus 39 from behind the holder 35, are respectively inserted into each of the holes 38. When a substrate 1 is transported by the transfer apparatus 24 into the vacuum treatment chamber 4 through the opening 33, it is supported by each of the pins 16 which are lifted through the heating means 51 such that the substrate 1 is lifted off the transfer apparatus 24. When the transfer apparatus 24 is withdrawn from the opening 33 each of the pins 16 is lowered to a position at which the substrate 1 is positioned on the upper surface of the heating means 51, and the substrate 1 is heated for ashing. When the ashing of the substrate 1 has been finished, the substrate 1 is lifted up by each of the pins 16 above the heating means 51 to an advanced position to form a distance 17 between the heating means 51 and the substrate 1. This ashing of the resist film on the rear surface of the substrate 1, is then carried out. Once the ashing of the front and rear surfaces of the substrate 1 is finished, the transfer apparatus 24 moves into the distance 17. Each of the pins 16 is then lowered with the substrate 1 supported in the middle of its lowering movement by the transfer apparatus 24, and the substrate 1 is carried out through the opening 33 of the vacuum treatment chamber 4.

The lifting apparatus 39 incorporates a lifting bar 39a which extends from the bottom surface of the vacuum treatment chamber 4 towards the outside thereof through a sealing apparatus 41, a connecting plate 39c which is mounted at the lower end of the lifting bar 39a, and a threaded shaft 39d which threadingly engages the connecting plate 39c. When the rotation of a synchronous motor 43 which is mounted on a fixed plate 42 outside the vacuum treatment chamber 4 is transmitted to a gear wheel 39e which is integral with a threaded shaft 39d supported on fixed plate 42 via its output shaft 44 and an idle gear wheel 45, the threaded shaft 39d rotates, the connecting plate 39c and the lifting bar 39a are lifted or lowered, and consequently the lifting plate 39b is lifted or lowered together with the pins 16. The pins 16 have their bottom portions inserted into holes 39f in the lifting plate 39b and are fixed by springs 39g.

Figure 28:
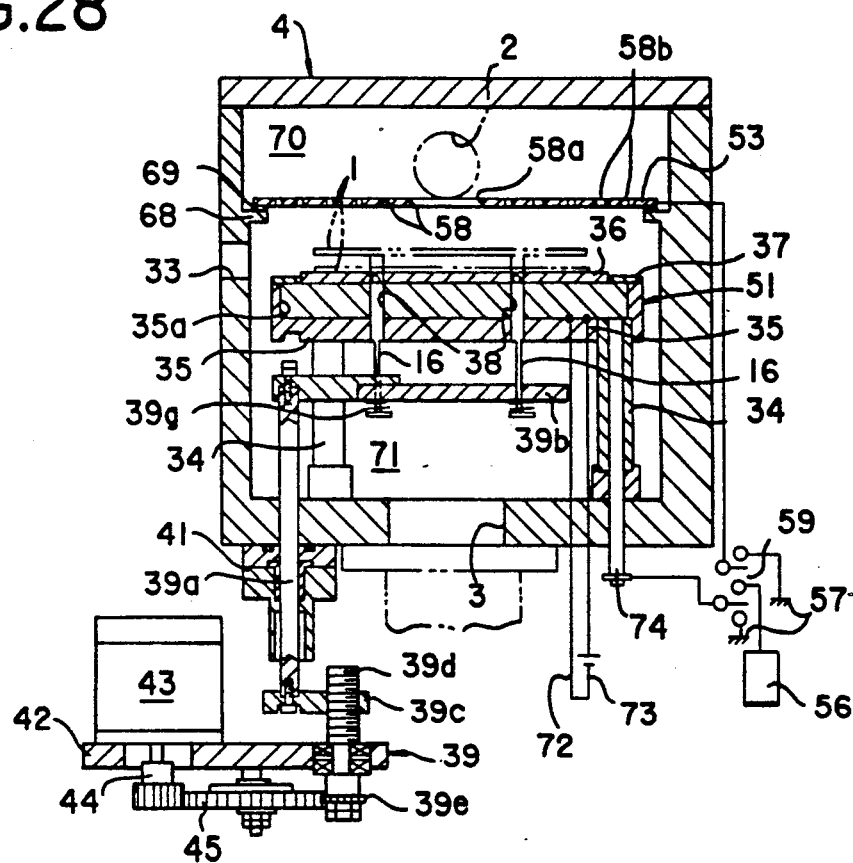

The apparatus shown in FIG. 16 is also provided, in concrete, with the construction as shown in FIGS. 20 through 26, and the vacuum treatment chamber 4 thereof is constructed as shown in FIG. 28. The vacuum treatment chamber 4 of FIG. 28 is operated such that, when a substrate 1 is transported into the vacuum treatment chamber 4 by the transfer apparatus 24, the substrate 1 is supported by the pins 16 which rise through the heating means 51, to lift it off the transfer apparatus 24, and that, when the transfer apparatus 24 has been withdrawn through the opening 33, the pins 16 are lowered to position the substrate 1 in a position 1 to 2 mm above the heating means 51, thereby performing the etching, ashing and heating for ashing respectively, of the resist film of the substrate 1. Inside the vacuum treatment chamber 4 there is provided an inwardly projecting stepped portion 68 between the opening 33 and the reactive gas introduction port 2 of the gas introduction pipe 12. In the stepped portion 68 the front electrode 53 or a circular plate which has a large-diameter through opening 58a and small-diameter holes 58b in the peripheries thereof is placed through an electrically insulating material 69 so that the vacuum treatment chamber is divided by the front electrode 53 into two chambers 70, 71. The front electrode 53 is selectively connected to a high-frequency power source 56 or ground 57 via a switch 59 outside the vacuum treatment chamber 4.

Further, wiring 72, 73 is connected to the heating means 5 from a power source outside the vacuum treatment chamber 4. Through its energization the heating means 51 heats substrate 1. An electrically conducting shaft 74 is introduced and connected from outside the vacuum treatment chamber 4 to the heating means 51 through the inside of one of the supports 34 which support the heating means 51. By selectively connecting the electrically conducting shaft 74 to the high-frequency power source 56 or to the ground 57 via the switch 59, the heating means 51 is made to function as the rear electrode 55.

Figure 29:
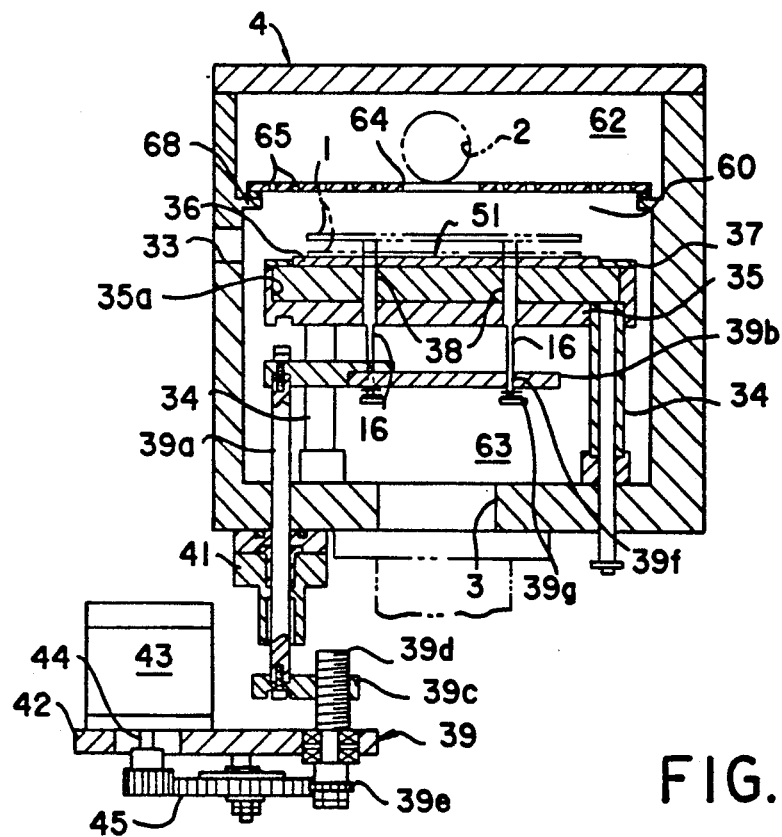

The apparatus shown in FIG. 19 is provided, in concrete, with the construction as shown in FIGS. 20 through 26 and the vacuum treatment chamber 4 is constructed as shown in FIG. 30. The vacuum treatment chamber 4 of FIG. 29 has, in addition to the construction of the vacuum treatment chamber 4 shown in FIG. 27, an inwardly projecting stepped portion 68 between an opening 33 and a reactive gas introduction port 2. In the stepped portion 68 a shower plate 61 which has a large-diameter through hole 64 and small-diameter holes 65 in the peripheries thereof is placed at a distance 60 from the surface of the substrate 1 so that the vacuum treatment chamber 4 is divided by the shower plate 61 into two chambers 62, 63.

In summary, in removing the resist film coated on the substrate by ashing, since the temperature of the substrate can be maintained at a low temperature until the surface layer of the resist film has been removed and then changed to a high temperature after the removal of the surface layer, the resist film can be removed by ashing without generating an explosion and it can be advantageously applied to the fabrication of hyperfine semiconductor circuits.

Since the radicals of the reactive gas to be introduced into the vacuum treatment chamber penetrate into the distance formed between the substrate and the heating means, in accordance with embodiments disclosed above, the resist film adhered to the rear surface of the substrate can be removed by ashing, and therefore a disadvantage in that the resist film remains on the substrate can be eliminated. In accordance with other embodiments, the front electrode is disposed in front of the substrate to be ashed at a distance capable of generating plasma therein and, at the same time, the rear electrode is disposed in the rear surface of the substrate at a narrow distance incapable of generating plasma therein. These electrodes are arranged such that they are selectively connected to the high-frequency power source and to the ground. The effect created by this construction is that the resist film having a surface layer which has been affected and hardened can be completely removed and that ashing can be performed by changing the electric connection to the electrodes while preventing damage to the substrate. Further, in accordance with additional embodiments disclosed above the vacuum treatment chamber is divided into two chambers by providing a perforated shower plate along that surface of the substrate which is coated with a resist film, and the vacuum exhaust pipe is provided on that side of the chamber in which the substrate is placed and the reaction gas introduction pipe is provided on the other side of the chamber. The effect created by this construction is that the reactive gas uniformly contacts the entire surface of the substrate and that plasma ashing of the resist film can be performed at high ashing speeds.

What is claimed:

1. A plasma ashing method for removing a resist film on a coated substrate comprising the steps of:
   placing the substrate coated with said resist film in a vacuum chamber;
   simultaneously ashing the resist film by an oxygen plasma while heating the substrate to remove said resist film;
   initially maintaining a temperature of the substrate during said step of ashing at a temperature below that at which explosion of said resist film occurs until a surface portion of said resist film has been removed; and
   thereafter increasing the temperature during said step of ashing to remove remaining portions of said resist film.

2. A plasma ashing apparatus comprising:
   a vacuum treatment chamber for receiving a substrate coated with a resist film;
   a vacuum exhaust port in open communication with the vacuum treatment chamber;
   heating means located within the vacuum treatment chamber for heating the substrate;
   a plurality of pins for supporting a rear surface of the substrate a distance away from the heating means;
   introducing port means for introducing reactive gas radicals to said vacuum treatment chamber, the reactive gas radicals being formed from an oxygen-containing gas and being capable of removing the resist film from the substrate by ashing; and
   means for generating reactive gas radicals to be introduced into said vacuum treatment chamber with said introducing port means.

3. A plasma ashing apparatus according to claim 2 wherein said plurality of pins are movably disposed between an advanced position and a retracted position, the advanced position being such that a distance is formed between a rear surface of the substrate and said heating means, the retracted position being such that the rear surface of the substrate contacts said heating means.

4. A plasma ashing apparatus comprising:
   a vacuum treatment chamber for receiving a substrate coated with a resist film;
   a vacuum exhaust port in open communication with said vacuum treatment chamber;
   heating means located within said vacuum treatment chamber for heating the substrate;
   means for introducing reaction gas radicals to said vacuum treatment chamber, the reaction gas radicals formed from an oxygen-containing gas and being capable of removing the resist film from the substrate by ashing;
   means associated with said introducing means for generating the reaction gas radicals;
   a front electrode disposed in front of the substrate, in an opposed relation thereto, at a distance capable of generating a plasma;
   a rear electrode disposed on a rear side of the substrate in an opposed relationship thereto, said rear electrode being disposed at a narrow distance relative to the rear side of the substrate whereby a plasma is incapable of being generated; and
   a high-frequency power source and a ground, said front and rear electrodes selectively connected to said power source and ground.

5. A plasma ashing apparatus according to claim 4, wherein said front electrode is a plate having a plurality of perforations.

6. A plasma ashing apparatus comprising:
   a vacuum treatment chamber for receiving a substrate coated with a photo resist film on a surface thereof, said vacuum treatment chamber having therein heating means to heat said substrate;
   a reactive gas introduction pipe for conveying a reactive gas to said vacuum treatment chamber and having, in an intermediate portion of said reactive gas introduction pipe, a plasma applicator to generate plasma of the reactive gas; and
   a vacuum exhaust pipe having, at a first end, a vacuum exhaust port in open communication with said vacuum treatment chamber and having a second end connected to a vacuum pump, an inside of said vacuum treatment chamber being divided into two chambers by a shower plate,
   the shower plate including a perforated plate provided along a surface of the substrate, and further the shower plate having defined thereon a plurality of small holes on a majority of its surface and a hole of larger diameter relative to the plurality of small holes, located on the surface of the shower plate in a position which faces the surface of the substrate at a central portion thereof,
   said vacuum exhaust pipe being connected to a first side of the two chambers in which the substrate is located, and
   said reactive gas introduction pipe being connected to a second side of the two chambers whereby reactive gas introduced from said reactive gas introduction pipe, in an ionized condition, is caused to flow along a surface of the substrate to ash the resist film on the surface of the substrate.

7. A plasma ashing apparatus according to claim 6, wherein said vacuum exhaust port opens into a position facing a rear surface of the substrate.

8. A plasma ashing apparatus according to claim 6 further comprising: a thermometer in association with said vacuum treatment chamber to measure a temperature of the surface of the substrate through the large diameter hole in the shower plate.

* * * * *